(12) United States Patent
Haukka et al.

(10) Patent No.: US 10,707,082 B2
(45) Date of Patent: *Jul. 7, 2020

(54) METHODS FOR DEPOSITING THIN FILMS COMPRISING INDIUM NITRIDE BY ATOMIC LAYER DEPOSITION

(75) Inventors: Suvi Haukka, Helsinki (FI); Viljami J. Pore, Helsinki (FI); Antti Niskanen, Helsinki (FI)

(73) Assignee: ASM International N.V., Almere (NL)

( * ) Notice: Subject to any disclaimer, the term of this patent is extended or adjusted under 35 U.S.C. 154(b) by 169 days.

This patent is subject to a terminal disclaimer.

(21) Appl. No.: 13/525,072

(22) Filed: Jun. 15, 2012

(65) Prior Publication Data

US 2013/0109160 A1    May 2, 2013

Related U.S. Application Data

(60) Provisional application No. 61/504,985, filed on Jul. 6, 2011.

(51) Int. Cl.
| | |
|---|---|
| *H01L 21/205* | (2006.01) |
| *H01L 21/02* | (2006.01) |
| *C23C 16/30* | (2006.01) |
| *C23C 16/455* | (2006.01) |
| *C30B 25/14* | (2006.01) |
| *C30B 29/40* | (2006.01) |

(52) U.S. Cl.
CPC ........ *H01L 21/2056* (2013.01); *C23C 16/303* (2013.01); *C23C 16/4554* (2013.01); *C30B 25/14* (2013.01); *C30B 29/406* (2013.01); *H01L 21/0254* (2013.01); *H01L 21/0262* (2013.01); *H01L 21/02579* (2013.01)

(58) Field of Classification Search
CPC ............. H01L 21/2056; H01L 21/0254; H01L 21/02579; H01L 21/0262; C23C 16/303; C23C 16/4554; C30B 25/14; C30B 29/406
USPC ......................................................... 438/503
See application file for complete search history.

(56) References Cited

U.S. PATENT DOCUMENTS

| | | | | |
|---|---|---|---|---|
| 4,058,430 A | * | 11/1977 | Suntola ................... | C23C 14/02 427/255.13 |
| 6,602,549 B1 | * | 8/2003 | Baum et al. .................. | 427/252 |
| 7,682,657 B2 | * | 3/2010 | Sherman .................... | 427/248.1 |
| 7,713,874 B2 | * | 5/2010 | Milligan ....................... | 438/680 |
| 8,143,147 B1 | * | 3/2012 | Kraus ................... | C23C 16/303 117/102 |
| 8,298,624 B2 | * | 10/2012 | Butcher et al. ............... | 427/569 |
| 8,450,190 B2 | * | 5/2013 | Cheng et al. ................. | 438/478 |

(Continued)

FOREIGN PATENT DOCUMENTS

WO    WO2011056519 A2 *  5/2011  .......... H01L 21/205

OTHER PUBLICATIONS

Leskela et al, "Atomic layer deposition (ALD): from precursors to thin film structures", Thin Solid Films 409 (2002) 138-146.*

(Continued)

*Primary Examiner* — Allen L Parker
*Assistant Examiner* — Charles N Ausar-El
(74) *Attorney, Agent, or Firm* — Knobbe, Martens, Olson & Bear LLP

(57) ABSTRACT

Atomic layer deposition (ALD) processes for forming thin films comprising InN are provided. The thin films may find use, for example, in light-emitting diodes.

26 Claims, 15 Drawing Sheets

(56) References Cited

U.S. PATENT DOCUMENTS

| | | | |
|---|---|---|---|
| 8,846,502 B2* | 9/2014 | Haukka | H01L 21/2056 438/478 |
| 9,243,329 B2* | 1/2016 | Dietz | C23C 16/45544 |
| 2002/0016084 A1 | 2/2002 | Todd | |
| 2004/0018750 A1* | 1/2004 | Sophie | C23C 16/36 438/792 |
| 2007/0269965 A1* | 11/2007 | Gil et al. | 438/488 |
| 2007/0281082 A1* | 12/2007 | Mokhlesi et al. | 427/248.1 |
| 2008/0142846 A1* | 6/2008 | Kim et al. | 257/200 |
| 2008/0254231 A1* | 10/2008 | Lin | C23C 16/403 427/576 |
| 2008/0272463 A1* | 11/2008 | Butcher et al. | 257/615 |
| 2008/0317972 A1* | 12/2008 | Hendriks et al. | 427/569 |
| 2009/0197399 A1* | 8/2009 | Nakamura et al. | 438/503 |
| 2009/0214767 A1* | 8/2009 | Wang et al. | 427/126.1 |
| 2010/0009078 A1* | 1/2010 | Pore et al. | 427/255.28 |
| 2010/0062149 A1* | 3/2010 | Ma et al. | 427/126.1 |
| 2010/0062614 A1* | 3/2010 | Ma et al. | 438/785 |
| 2010/0136313 A1* | 6/2010 | Shimizu et al. | 428/220 |
| 2010/0240167 A1 | 9/2010 | Dasgupta et al. | |
| 2011/0027977 A1* | 2/2011 | Li | 438/584 |
| 2011/0104906 A1* | 5/2011 | Tois et al. | 438/762 |
| 2011/0146568 A1* | 6/2011 | Haukka et al. | 118/200 |
| 2011/0162580 A1* | 7/2011 | Provencher et al. | 118/715 |
| 2011/0207283 A1* | 8/2011 | Haukka et al. | 438/381 |
| 2012/0058282 A1 | 3/2012 | Hong et al. | |
| 2012/0211870 A1* | 8/2012 | Figuet | H01L 21/0237 257/615 |
| 2012/0315741 A1 | 12/2012 | Su et al. | |
| 2012/0329208 A1* | 12/2012 | Pore et al. | 438/102 |
| 2013/0012003 A1* | 1/2013 | Haukka | H01L 21/2056 438/478 |
| 2013/0181331 A1* | 7/2013 | Srinivasan | C23C 16/36 257/649 |
| 2013/0244408 A1* | 9/2013 | Moseley | C30B 23/02 438/478 |
| 2013/0244410 A1* | 9/2013 | Arena et al. | 438/503 |
| 2014/0287164 A1* | 9/2014 | Xiao et al. | 427/579 |

OTHER PUBLICATIONS

Kai-Erik Elers, "Brief Overview of Microsystems and Nanoelectronics", Seminar Presentation at UC Berkeley, VTT Technical Research Centre of Finland. (Year: 2010).*

Ritala et. al., "Atomic layer epitaxy—a valuable tool for nanotechology?" Nanotechnology 10 (1999) 19-24. (Year: 1999).*

Sato, "Epitaxial Growth of InN by Plasma-Assisted Metalorganic Chemical Vapor Deposition", Jpn. J. Appl. Phys. vol. 36 (1997) pp. 595-597, Part 2, No. 5B, May 15, 1997. (Year: 1997).*

Adelmann et al., :"Atomic-layer epitaxy of GaN quantum wells and quantum dots on (0001) AlN", Journal of Applied Physics, vol. 91, No. 8, pp. 5498-5500, Apr. 15, 2002.

Adelmann et al., "Atomic Layer Epitaxy of Hexagonal and Cubic GaN Nanostructures", Phys. Status Solidi A, vol. 188, No. 2, pp. 673-676, 2001.

Boutros et al., "High quality InGaN films by atomic layer epitaxy", Appl. Phys. Lett., vol. 67, No. 13, 1856-1858, Sep. 25, 1995.

Huang et al., "Growth of wurtzite GaN on (0 0 1) GaAs substrates at low temperature by atomic layer epitaxy", Journal of Materials Science Letters, vol. 17, pp. 1281-1285, 1998.

Karam et al., "Growth of device quality GaN at 550° C. by atomic layer epitaxy", Appl. Phys. Lett., vol. 67, No. 1, pp. 94-96, Jul. 3, 1995.

Khan et al., "Atomic layer epitaxy of GaN over sapphire using switched metalorganic chemical vapor deposition", Appl. Phys. Lett., vol. 60, No. 11, pp. 1366-1368, Mar. 16, 1992.

Khan et al., "GaN/AlN digital alloy short-period superlattices by switched atomic layer metalorganic chemical vapor deposition", Appl. Phys. Lett., vol. 63, No. 25, pp. 3470-3472, Dec. 20, 1993.

Khan et al., "High-responsivity photoconductive ultraviolet sensors based on Insulating single-crystal GaN epilayers", Appl. Phys. Lett., vol. 60, No. 23, pp. 2917-2919, Jun. 8, 1992.

Kim et al., "Atomic layer deposition of GaN using $GaCl_3$ and $NH_3$", J. Vac. Sci. Technol. A, vol. 27, No. 4, pp. 923-928, Jul./Aug. 2009.

Koukitu et al., "Halogen-Transport Atomic-Layer Epitaxy of Cubic GaN Monitored by In Situ Gravimetric Method", Jpn. J. Appl. Phys., Part 1, vol. 38, pp. 4980-4982, 1999.

Kumagai et al., "In situ gravimetric monitoring of halogen transport atomic layer epitaxy of cubic-GaN", Applied Surface Science, vol. 159-160, pp. 427-431, 2000.

McIntosh et al., "Epitaxial deposition of GaInN and InN using the rotating susceptor ALE system", Applied Surface Science, vol. 112, pp. 98-101, 1997.

Özgit et al., "Self-limiting growth of GaN using plasma-enhanced atomic layer deposition", ALD 2011, 11th International Conference on Atomic Layer Deposition, Jun. 26-29, 2011, Cambridge, MA USA (Abstract).

Piner et al., "Effect of hydrogen on the indium incorporation in InGaN epitaxial films", Appl. Phys. Lett., vol. 70, No. 4, pp. 461-463, Jan. 27, 1997.

Sumakeris et al., "Layer-by-layer epitaxial growth of GaN at low temperatures", Thin Solid Films, vol. 225, pp. 244-249, 1993.

Tsai et al., Morphological and luminescent characteristics of GaN dots deposited on AlN by alternate supply of TMG and $NH_3$, Applied Surface Science, vol. 252, pp. 3454-3459, 2006.

Tsuchiya et al., "Layer-by-Layer Growth of GaN on GaAs Substrates by Alternate Supply of $GaCl_3$ and $NH_3$", Jpn. J. Appl. Phys., Part 2, vol. 35, pp. L748-L750, Jun. 15, 1996.

Wang et al., "Growth and characterization of GaN films on (0001) sapphire substrates by alternate supply of trimethylgallium and $NH_3$", Materials Science and Engineering, vol. B57, pp. 218-223, 1999.

* cited by examiner

METHODS FOR DEPOSITING THIN FILMS COMPRISING INDIUM NITRIDE BY ATOMIC LAYER DEPOSITION

REFERENCE TO RELATED APPLICATIONS

The present application claims priority under 35 U.S.C. § 119(e) to U.S. provisional application No. 61/504,985, filed Jul. 6, 2011, the disclosure of which is hereby incorporated by reference.

BACKGROUND OF THE INVENTION

Field of the Invention

The present application relates generally to methods and compounds for forming thin films comprising indium nitride (InN) by atomic layer deposition. Such films may find use, for example, in optoelectronic applications, such as light emitting diodes (LEDs).

Description of the Related Art

Currently several issues plague the manufacturing of InN and GaN-based LEDs: poor yield of devices producing the desired wavelength and subsequent need for cumbersome device sorting, and decreasing revenue per substrate (the price ratio of LEDs producing the desired wavelength and ones with a slight deviation from this wavelength is roughly 500:1). Currently an InGaN/GaN multi-quantum well (MQW) structure in HB-LEDs is deposited by MOCVD and the deposition involves thermal cycling between approximately 700° C. and 950° C. The high temperature used limits, due to diffusion, the maximum indium concentration in the InGaN; in practice the indium concentration is limited roughly to 20 atom-% before significant diffusion of indium occurs. Additionally, in the MOCVD deposited HBLED, small variations in the deposition temperature inside the substrate area lead to minute changes in indium concentration in the InGaN layer and, subsequently, a change in the emission wavelength, leading to poor yield due to poor indium uniformity in indium content in InGaN. MOCVD also has limitations in maximum obtainable indium concentration in InGaN, limited earlier by increased mobility due to thermal cycling, thermal budget, and temperature uniformity requirements.

A need exists, therefore, for methods for controllably and reliably forming thin films comprising InN by ALD.

SUMMARY OF THE INVENTION

The methods disclosed herein provide reliable atomic layer deposition (ALD) methods for forming thin films comprising InN. The thin films can be used, for example, in quantum well structures, LEDs and lasers. The films can be doped, for example with one or more of Ga, Al, Mg, P or other dopants.

In accordance with one aspect of the present invention, atomic layer deposition (ALD) processes for forming an InN containing thin film on a substrate in a reaction chamber are provided. The processes typically comprise a plurality of deposition cycles, each cycle comprising: providing a pulse of a first vapor phase In reactant into the reaction chamber to form no more than about a single molecular layer of the In reactant on the substrate; removing excess first reactant from the reaction chamber; providing a pulse of a second vapor phase reactant comprising N to the reaction chamber such that the second vapor phase reactant reacts with the In reactant on the substrate to form an InN containing thin film; and removing excess second reactant and reaction byproducts, if any, from the reaction chamber. In some embodiments the reaction chamber is part of a flow-type reactor. In some embodiments the thin film is an epitaxial or single crystal film. The growth rate of the thin film may be less than about 2 angstroms/cycle, less than about 1.5 angstroms/cycle, less than about 1 angstrom/cycle, less than about 0.5 angstrom/cycle or even less than about 0.3 angstrom/cycle depending on the reaction conditions.

In some embodiments, a thermal ALD process is used to deposit an InN containing thin film. The In reactant may be an In halide, such as $InCl_3$ or $InI_3$ and the second reactant may be a nitrogen containing reactant such as $NH_3$ or $N_2H_4$. The temperature of the process is preferably below about 800° C., below about 700° C., below about 600° C., below about 500° C. or below about 400° C. The reaction chamber may be part of a flow-type reactor. In some embodiments the deposited film is an epitaxial or single-crystal film.

In other embodiments, a thermal ALD process uses an organic In precursor, such as cyclopentadienylindium (InCp), dimethylethylindium (DMEI), trimethylindium (TMI) or triethylindium (TEI). In some embodiments, the organic In precursor has the formula $InR_3$, wherein the R is selected from the group consisting of substituted, branched, linear and cyclic C1-C10 hydrocarbons. The second reactant may be a nitrogen containing reactant such as $NH_3$ or $N_2H_4$. The temperature of the process is preferably selected such that the In reactant does not decompose, for example below about 400° C. or below about 300° C., depending on the particular reactant employed. The reaction chamber may be part of a flow-type reactor. In some embodiments the deposited film is an epitaxial or single-crystal film.

In other embodiments, a plasma ALD process is used to deposit an InN containing thin film. In some such embodiments, the In precursor may be, for example, an In halide precursor, such as $InCl_3$ or $InI_3$. The second reactant comprising N may be a nitrogen plasma containing precursor. In some embodiments the nitrogen plasma is generated in situ, for example above or directly in view of the substrate. In other embodiments the nitrogen plasma is formed remotely, for example upstream of the substrate or upstream of the reaction chamber in which the substrate is housed. In some such embodiments, the nitrogen plasma does not have a substantial amount of N ions, and is primarily N atoms. In some embodiments the second reactant also comprises hydrogen plasma. In some embodiments the second reactant is a mixture of $H_2/N_2$ plasma. In some embodiments the second reactant is a nitrogen and hydrogen containing plasma created from $H_2/N_2$ gas mixture, which preferably has an $H_2$:$N_2$ ratio above 3:1, more preferably above 4:1 and most preferably above 5:1. In some cases $H_2$:$N_2$ ratios from about 5:1 to about 10:1 can be used. The reaction temperature may be, for example, less than about 500° C., less than about 400° C., less than about 300° C. or even less than about 200° C. In some cases the reaction temperature is less than about 100° C. The process may be performed in a flow-type reactor. In some embodiments the deposited film is an epitaxial or single-crystal film.

In other plasma ALD processes an organic In reactant is used, such as dimethylethylindium (DMEI), trimethylindium (TMI) or triethylindium (TEI). In some embodiments, the organic In precursor has the formula $InR_3$, wherein the R is selected from the group consisting of substituted, branched, linear and cyclic C1-C10 hydrocarbons. In some embodiments the In precursor is not an In-halide, such as $InCl_3$. The second reactant comprising N may be a nitrogen plasma containing precursor. In some embodiments the nitrogen plasma is generated in situ, for example above or directly in view of the substrate. In other embodiments the nitrogen plasma is formed remotely, for example upstream of the substrate. In some such embodiments, the nitrogen plasma does not have a substantial amount of N ions, and is primarily N atoms. In some embodiments the second reactant also comprises hydrogen plasma. In some embodiments the second reactant also comprises ammonia ($NH_3$) plasma. In some embodiments the second reactant is a mixture of $H_2/N_2$ plasma. In some embodiments the second reactant is a nitrogen and hydrogen containing plasma created from $H_2/N_2$ gas mixture which preferably has a $H_2:N_2$ ratio above 3:1, more preferably above 4:1 and most preferably above 5:1. In some embodiments $H_2:N_2$ ratios from about 5:1 to about 10:1 can be used. In some embodiments the second reactant is a nitrogen and hydrogen containing plasma created from $H_2/N_2$ gas mixture which preferably has a $H_2:N_2$ ratio below 3:1, more preferably below 5:2 and most preferably below 5:4. In some embodiments $H_2:N_2$ ratios from about 1:4 to about 1:2 can be used. The reaction temperature is generally chosen such that the In precursor does not decompose and may be, for example, less than about 400° C., less than about 300° C. or even less than about 200° C., depending on the precursor. The process may be performed in a flow-type reactor. In some embodiments the deposited film is an epitaxial or single-crystal film.

DETAILED DESCRIPTION OF THE PREFERRED EMBODIMENT

Figure 1A:
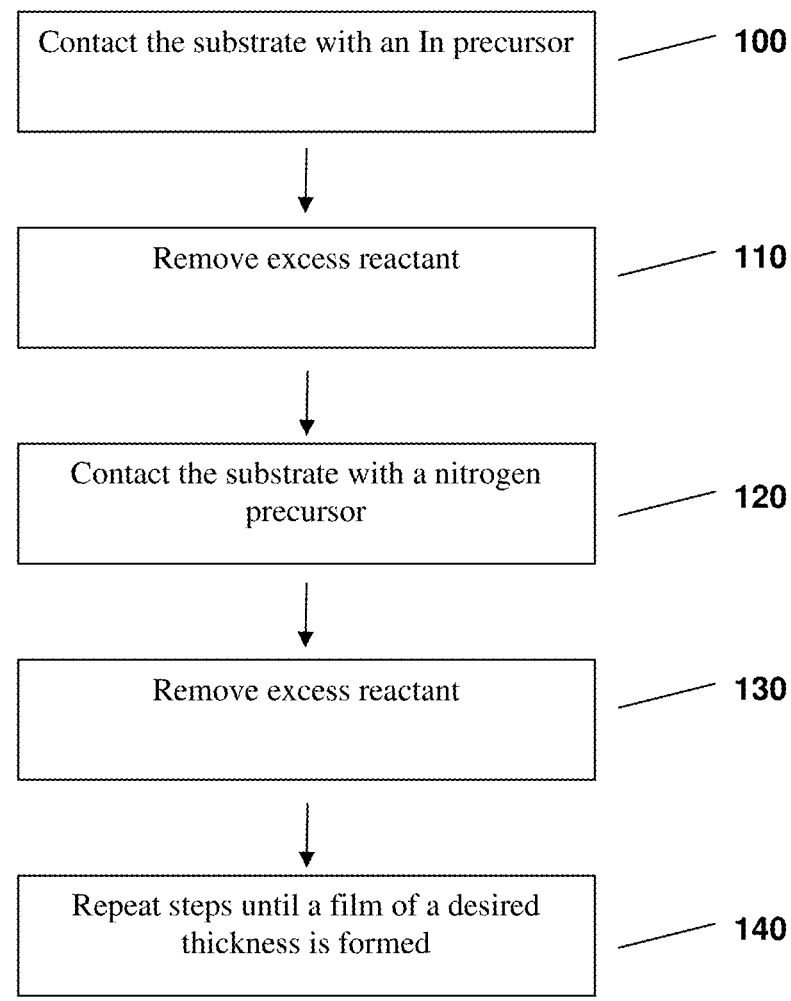
FIG. 1A is a flow chart generally illustrating a method for forming an InN film in accordance with some embodiments.

As discussed above, InN-containing films find use in a variety of applications, including p quantum well structures, LEDs and lasers. The films can be doped additionally with Ga, Al, Mg, P or other dopants.

Deposition of indium containing thin films, such as indium oxides, by using chemical deposition methods like CVD or ALD has been more difficult than in the case of gallium deposition. Fewer suitable (for example volatile enough) indium precursors have been available for vapor deposition methods. For example in current LED processing, deposition of In-containing thin films of sufficient quality has been more difficult than GaN deposition. Embodiments herein can be used to reliably deposit InN thin films, for example achieving controlled composition throughout InN films and doped InN and GaN films or nanolaminate films.

While the embodiments of the present invention are discussed in the general context of high brightness LEDs (HB-LEDs), the skilled artisan will appreciate that the principles and advantages taught herein will have application to other devices and applications. Furthermore, while a number of processes are disclosed herein, one of ordinary skill in the art will recognize the utility of certain of the disclosed steps in the processes, even in the absence of some of the other disclosed steps, and similarly that subsequent, prior and intervening steps can be added.

InN containing films, including those doped with Ga, Al, Mg, P or other dopants, can be deposited on a substrate by atomic layer deposition (ALD) type processes. ALD type processes are based on controlled, self-limiting surface reactions of precursor chemicals. Gas phase reactions are avoided by feeding the precursors alternately and sequentially into the reaction chamber. Vapor phase reactants are separated from each other in the reaction chamber, for example, by removing excess reactants and/or reactant byproducts from the reaction chamber between reactant pulses.

Briefly, a substrate is loaded into a reaction chamber and is heated to a suitable deposition temperature, generally at lowered pressure. In some embodiments the reaction chamber is part of a flow-type reactor. Thus, in some embodiments reactants flow from an inlet, over the substrate and to a separate outlet. Reactants may be provided with the aid of a carrier gas, preferably an inert carrier gas or a mixture of gases ($Ar+H_2$ for example).

Examples of suitable reactors that may be used include commercially available ALD equipment such as the F-120® reactor, Pulsar® reactor and Advance® 400 Series reactor, EmerALD available from ASM America, Inc of Phoenix, Ariz. and ASM Europe B.V., Almere, Netherlands. In addition to these ALD reactors, many other kinds of reactors capable of ALD growth of thin films, including CVD reactors equipped with appropriate equipment and means for pulsing the precursors can be employed. Preferably, reactants are kept separate until reaching the reaction chamber, such that shared lines for the precursors are minimized.

The growth processes can optionally be carried out in a reactor or reaction space connected to a cluster tool. In a cluster tool, because each reaction space is dedicated to one type of process, the temperature of the reaction space in each module can be kept constant, which improves the throughput compared to a reactor in which the substrate is heated up to the process temperature before each run.

A stand-alone reactor can be equipped with a load-lock. In that case, it is not necessary to cool down the reaction space between each run.

In embodiments in which at least one of the reactants comprise a plasma reactant (a plasma-enhanced ALD or PEALD process), the plasma may be generated in situ, that is above or in direct line of sight of the substrate. In other embodiments the plasma is generated remotely, upstream of the substrate or upstream of the chamber housing the substrate during deposition.

Deposition temperatures are typically maintained below the thermal decomposition temperature of the reactants but at a high enough level to avoid condensation of reactants and to provide the activation energy for the desired surface reactions. Of course, the appropriate temperature window for any given ALD reaction will depend upon a variety of factors including the surface termination and reactant species involved. Here, the temperature varies depending on the type of film being deposited and the nature of the reactants. The temperature is preferably at or below about 800° C. for thermal ALD processes, more preferably at or below about 400° C. For processes that use plasma, the deposition temperature is preferably at or below about 400° C., more preferably at or below about 200° C. and in some cases even below about 100° C.

In some embodiments InN is formed using an InN deposition cycle in which a substrate is alternately and sequentially contacted with an In precursor and a N precursor. The InN deposition methods described herein can be thermal ALD, plasma ALD, or a combination of thermal and plasma ALD, as discussed below. FIG. 1A is a flow chart generally illustrating a method for forming an InN film in accordance with some embodiments. The substrate is contacted with an In precursor 100 followed by removing any excess reactant 110. The substrate is then contacted with a nitrogen precursor 120 followed by removing any excess reactant 130. The steps are repeated until a film of a desired thickness is formed 140.

In some embodiments, in an InN deposition cycle a first In reactant is conducted or pulsed into the chamber in the form of a vapor phase pulse and contacted with the surface of the substrate. Conditions are preferably selected such that no more than about one monolayer of the first In reactant is adsorbed on the substrate surface in a self-limiting manner. The appropriate pulsing times can be readily determined by the skilled artisan based on the particular circumstances. In some embodiments, pulsing times are from about 0.05 to 10 seconds. In some embodiments the pulsing times are from about 0.05 s to about 1.0 s, preferably from about 0.1 s to about 0.5 s, more preferably from about 0.1 s to about 0.3 s.

In some embodiments the In reactant is an In halide, such as $InCl_3$ or $InI_3$. In other embodiments the In reactant may be an organic indium precursor, including a (metal)organic or organometallic In precursor. Exemplary precursors include cyclopentadienylindium (InCp), dimethylethylindium (DMEI), trimethylindium (TMI) or triethylindium (TEI). In some embodiments, the organic In precursor may have the formula $InR_3$, wherein the R is selected from substituted, branched, linear or cyclic C1-C10 hydrocarbons. In some embodiments 0-3 of the R groups are methyl and the rest are ethyl. In some embodiments, the In precursor may be, for example, an In halide precursor, such as $InCl_3$ or $InI_3$. In some embodiments, the In precursors has both a halide ligand and organic ligand, for example $InR_xX_{3-x}$, wherein x is from 1 to 2 and R is organic ligand, such as alkyl or alkenyl and X is halide, such as chloride. Examples of this kind of In precursors might be, for example, dimethylindiumchloride $(CH_3)_2InCl$. The precursors can be used in both thermal and plasma ALD processes.

In some embodiments the In precursor is not an In-halide, such as $InCl_3$.

Excess first reactant and reaction byproducts, if any, are removed from the reaction chamber, such as by purging with an inert gas. Purging the reaction chamber means that vapor phase precursors and/or vapor phase byproducts are removed from the reaction chamber such as by evacuating the chamber with a vacuum pump and/or by replacing the gas inside the reactor with an inert gas such as argon or nitrogen. Typical purging times are from about 0.05 to 20 seconds, more preferably between about 1 and 10, and still more preferably between about 1 and 2 seconds. However, other purge times can be utilized if necessary, such as where highly conformal step coverage over extremely high aspect ratio structures or other structures with complex surface morphology is needed.

A second gaseous reactant comprising N is pulsed into the chamber where it reacts with the first In reactant bound to the surface. The nitrogen precursor may be, for example, $NH_3$ or $N_2H_4$. In some embodiments the N precursor does not comprise an activated compound. However, in some embodiments the N precursor comprises nitrogen plasma. In some embodiments the nitrogen plasma is generated remotely and comprises primarily N atoms and does not comprise a substantial amount of N ions when it reaches the substrate. In some embodiments the second gaseous reactant also comprises hydrogen plasma. In some embodiments the second reactant is a mixture of $H_2/N_2$ plasma. In some embodiments the second reactant is a nitrogen and hydrogen containing plasma created from a $H_2/N_2$ gas mixture which preferably has a $H_2:N_2$ ratio above 3:1, more preferably above 4:1 and most preferably above 5:1. In some embodiments $H_2:N_2$ ratios from about 5:1 to about 10:1 can be used. In some embodiments the second reactant is a nitrogen and hydrogen containing plasma created from $H_2/N_2$ gas mixture which preferably has a $H_2:N_2$ ratio below 3:1, more preferably below 5:2 and most preferably below 5:4. In some embodiments $H_2:N_2$ ratios from about 1:4 to about 1:2 can be used.

Excess second reactant and gaseous byproducts of the surface reaction, if any, are removed from the reaction chamber, preferably by purging with the aid of an inert gas and/or evacuation. The InN deposition cycle, comprising the steps of pulsing and purging the first In precursor and the second N precursor, is repeated until a thin film of InN of the desired thickness has been formed on the substrate, with each cycle leaving no more than a molecular monolayer. Additional phases comprising provision of a reactant and purging of the reaction space can be included to form more complicated materials, such as ternary materials, as described in more detail below. Additional phases can also be used in some embodiments to enhance material properties such as crystallinity.

As mentioned above, each pulse or phase of each cycle is preferably self-limiting. An excess of reactant precursors is supplied in each phase to saturate the susceptible structure surfaces. Surface saturation ensures reactant occupation of all available reactive sites (subject, for example, to physical size or "steric hindrance" restraints) and thus ensures excellent step coverage.

Removing excess reactants can include evacuating some of the contents of the reaction space and/or purging the reaction space with helium, nitrogen or another inert gas. In some embodiments purging can comprise turning off the flow of the reactive gas while continuing to flow an inert, carrier gas to the reaction space.

The precursors employed in the ALD type processes may be solid, liquid or gaseous materials under standard conditions (room temperature and atmospheric pressure), provided that the precursors are in vapor phase before they are conducted into the reaction chamber and contacted with the substrate surface. "Pulsing" a vaporized precursor onto the substrate means that the precursor vapor is conducted into the chamber for a limited period of time. Typically, the pulsing time is from about 0.05 to 10 seconds. In some embodiments the pulsing time is from about 0.05 s to about 1.0 s, preferably from about 0.1 s to about 0.5 s, more preferably from about 0.1 s to about 0.3 s. However, depending on the substrate type and its surface area, and depending on the volume and shape of the reaction space, the pulsing time may be even higher than 10 seconds. Pulsing times can be on the order of minutes in some cases. The optimum pulsing time can be determined by the skilled artisan based on the particular circumstances.

The mass flow rate of the precursors can also be determined by the skilled artisan. In some single substrate chamber embodiments the flow rate of metal precursors is between about 1 and 1000 sccm without limitation, more preferably between about 100 and 500 sccm.

The pressure in the reaction chamber is typically from about 0.01 to about 20 mbar, more preferably from about 1 to about 10 mbar. However, in some cases the pressure will be higher or lower than this range, as can be determined by the skilled artisan given the particular circumstances. For example, during a purge step the pressure may be decreased to a level of about $10^{-6}$ mbar by pumping down the reaction space, for example, with the aid of turbo pump, if desired. During some purge steps the pressure may vary from about $10^{-6}$ mbar to about 20 mbar.

Before starting the deposition of the film, the substrate is typically heated to a suitable growth temperature. The growth temperature varies depending on the type of thin film formed, physical properties of the precursors, etc. The growth temperatures are discussed in greater detail below in reference to each type of thin film formed. The growth temperature can be less than the crystallization temperature for the deposited materials such that an amorphous thin film is formed or it can be above the crystallization temperature such that a crystalline thin film is formed. The preferred deposition temperature may vary depending on a number of factors such as, and without limitation, the reactant precursors, the pressure, flow rate, the arrangement of the reactor, crystallization temperature of the deposited thin film, and the composition of the substrate including the nature of the material on which deposition is to take place. The specific growth temperature may be selected by the skilled artisan.

Although the In reactant is referred to as the first reactant and the N containing reactant is referred to as the second reactant in the description above, the skilled artisan will recognize that in some situations the N containing reactant may be provided first.

In some embodiments, the reactants and reaction byproducts can be removed from the reaction chamber by stopping the flow of the In or N precursor (or other precursor) while continuing the flow of an inert carrier gas such as nitrogen or argon.

The growth rate of the InN containing thin film is generally less than about 2 angstroms per cycle, and may be less than 1.5 angstroms/cycle, less than about 1 angstrom/cycle, less than about 0.5 angstrom/cycle or even less than about 0.3 angstrom/cycle in some cases.

As mentioned above, additional phases comprising provision of a reactant can be included to form more complicated materials, such as ternary materials. In some embodiments the InN containing thin film may be doped with one or more additional dopant materials such as Ga, Al, Mg or P. In some embodiments, a third reactant or dopant precursor comprising one or more of these materials is provided at least once during each InN deposition cycle. In some embodiments the dopant precursor may replace the indium precursor in one or more deposition cycles. In other embodiments, the dopant precursor is provided in addition to the indium precursor in one or more deposition cycles. In some embodiments the dopant precursor can be provided together with the indium precursor. In some embodiments the dopant precursor can be provided separately from the indium precursor. The dopant precursor may be provided before or after the indium precursor (e.g. 100 in FIG. 1A) and/or before or after the nitrogen precursor (e.g. 120 in FIG. 1A).

In other embodiments, one or more different deposition cycles may be provided at a selected ratio with InN cycles to form a thin film with the desired composition. The thin film may be a doped InN film, or may be a nanolaminate film in which distinct layers of InN and one or more additional materials are formed. For example, a separate deposition cycle for forming a metal nitride such as AlN, GaN, or MgN, or other film may be used. The InN deposition cycle is carried out at a desired ratio to the other deposition cycle in order to obtain the desired composition in the InN film. The indium content can be expressed (using AlN as an example) as a percentage of the overall metal content in the film, e.g. In/(In+Al). In some embodiments the In/(In+Al) ratio in the deposited film is about 0-20% and preferably about 0-50%. In some embodiments the In/(In+Al) ratio in the deposited film is up to about 100%. Since growth is by ALD and therefore self-limited and independent of small temperature variations, a uniform composition, for example Ga, Mg, or Al, across the substrate surface can be obtained. The ratio of InN deposition cycles to other metal nitride deposition cycles or other deposition cycles can be selected such that a desired composition is achieved. In some embodiments the ratio of InN deposition cycles to InN plus other deposition cycles is less than about 0.5. In some embodiments the ratio of InN deposition cycles to InN plus other deposition cycles is less than about 0.4, preferably less than about 0.3, more preferably less than about 0.2, and in some cases less than about 0.1. In some embodiments, multiple cycles of InN are performed followed by multiple cycles of the other deposition cycle to form a nanolaminate film of InN and another material.

Excess second reactant and gaseous byproducts of the surface reaction, if any, are removed from the reaction chamber, preferably by purging with the aid of an inert gas and/or evacuation. The InN deposition cycle, comprising the steps of pulsing and purging the first In precursor and the second N precursor, is repeated until a thin film of InN of the desired thickness has been formed on the substrate, with each cycle leaving no more than a molecular monolayer. The InN and the AlN deposition cycle are repeated at an appropriate ratio to produce an InAlN film with the desired composition. For example, to achieve an In concentration of about 20-at %, 12 cycles of InN can be mixed with three cycles of AlN deposition. In some embodiments, an InAlN film comprising greater than about 30-at % In is deposited. Since growth is by ALD and therefore self-limited and relatively independent of small temperature variations, a uniform amount of doping across the substrate is obtained.

As mentioned above, in some embodiments InN is provided at a specified ratio with AlN. An AlN deposition cycle is similar to the InN deposition cycles described above. Thus, in some embodiments an AlN deposition cycle comprises providing a first aluminum precursor into the reaction chamber in the form of a vapor phase pulse such that it contacts the surface of the substrate. Conditions are preferably selected such that no more than about one monolayer of the first Al reactant is adsorbed on the substrate surface in a self-limiting manner. The appropriate pulsing times can be readily determined by the skilled artisan based on the particular circumstances. In some embodiments, pulsing times are from about 0.05 to 10 seconds. Example 8 provides an example of a suitable AlN deposition cycle. In some embodiments, where AlN can be deposited, preferably separately from the other materials, the reaction temperature for the AlN deposition is preferably less than 120° C., more preferably less than 100° C. and most preferably less than 50° C. In some cases the AlN is deposited at room temperature i.e. from about 20° C. to 25° C.

In some embodiments the Al reactant is an Al halide, such as $AlCl_3$ or $AlI_3$. In other embodiments the Al reactant may be an organic Al precursor, such as trimethylaluminum (TMA). The organic Al precursor may have the formula $AlR_3$, wherein the R is selected from substituted, branched, linear or cyclic C1-C10 hydrocarbons. In some embodiments 0-3 of the R groups are methyl and the rest are ethyl. In some embodiments, the Al precursors has both a halide ligand and organic ligand, for example $AlR_xX_{3-x}$, wherein x is from 1 to 2 and R is organic ligand, such as alkyl or alkenyl and X is halide, such as chloride. Examples of this kind of In precursors might be, for example, dimethylaluminumchloride $(CH_3)_2AlCl$.

Excess first reactant and reaction byproducts, if any, are removed from the reaction chamber, such as by purging with an inert gas and a second gaseous reactant comprising N is pulsed into the chamber where it reacts with the first Al reactant bound to the surface. The nitrogen precursor may be, for example, $NH_3$ or $N_2H_4$. In some embodiments the N precursor comprises nitrogen plasma.

Excess second reactant and gaseous byproducts of the surface reaction, if any, are removed from the reaction chamber, preferably by purging with the aid of an inert gas and/or evacuation. The AlN deposition cycle, comprising the steps of pulsing and purging the first Al precursor and the second N precursor, is repeated until a thin film of AlN of the desired thickness has been formed on the substrate, with each cycle leaving no more than a molecular monolayer. The AlN and the InN deposition cycle are repeated at an appropriate ratio to produce an AlInN film with the desired composition.

In other embodiments, a single In or Al reactant is used in an ALD process, where the single reactant comprises nitrogen and In or Al. In some embodiments plasma can be used with the single reactant, including hydrogen plasma, plasma generated from a mixture of hydrogen and nitrogen, and $NH_3$ plasma.

Figure 1B:
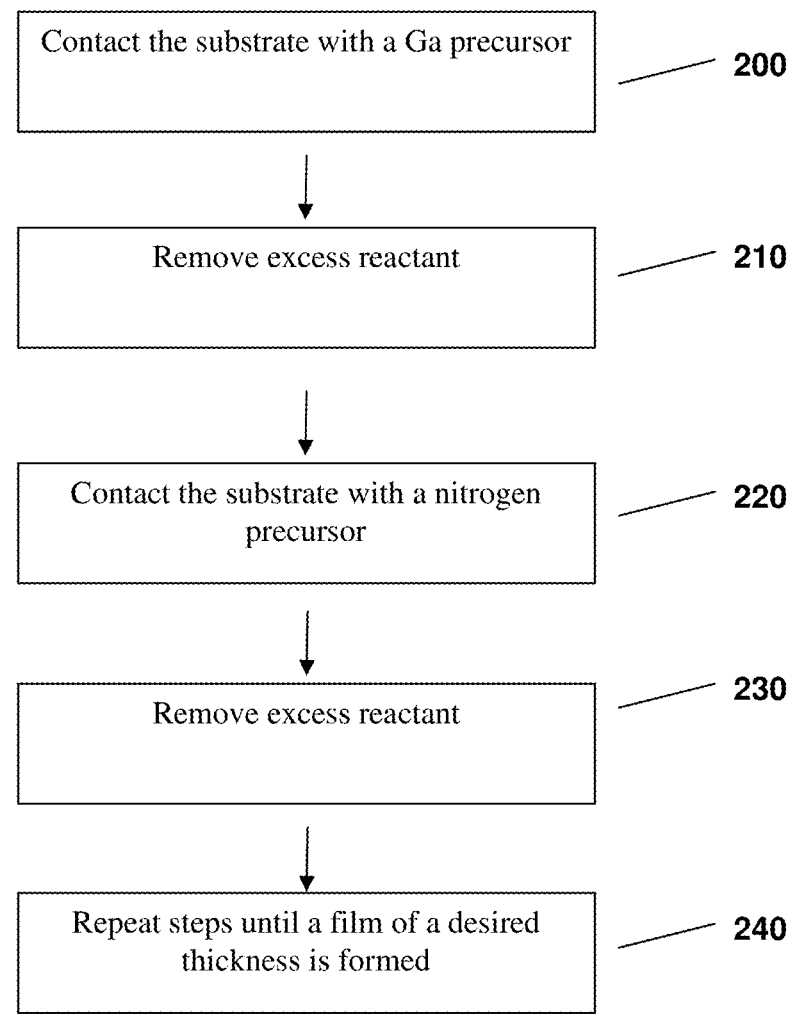
FIG. 1B is a flow chart generally illustrating a method for forming a GaN film in accordance with some embodiments.

As mentioned above, in some embodiments InN is provided at a specified ratio with GaN to deposit a film with a desired composition. A GaN deposition cycle similar to the InN deposition cycles described above can be used. For example, FIG. 1B is a flow chart generally illustrating a method for forming a GaN film in accordance with one embodiment. The substrate is contacted with a Ga precursor 200 followed by removing any excess reactant 210. The substrate is then contacted with a nitrogen precursor 220 followed by removing any excess reactant 230. The contacting steps are repeated until a film of a desired thickness is formed 240. In some embodiments an GaN deposition cycle comprises providing a first gallium precursor into the reaction chamber in the form of a vapor phase pulse such that it contacts the surface of the substrate. Conditions are preferably selected such that no more than about one monolayer of the first Ga reactant is adsorbed on the substrate surface in a self-limiting manner. The appropriate pulsing times can be readily determined by the skilled artisan based on the particular circumstances. In some embodiments, pulsing times are from about 0.05 to 10 seconds.

In some embodiments the Ga reactant is a Ga halide, such as $GaCl_3$, GaCl or $GaI_3$. In other embodiments the Ga reactant may be a metalorganic or organometallic Ga precursor, such as trimethylgallium (TMG) or triethylgallium (TEG). The organic Ga precursor may have the formula $GaR_3$, wherein the R is selected from substituted, branched, linear or cyclic C1-C10 hydrocarbons. In some embodiments 0-3 of the R groups are methyl and the rest are ethyl.

In some embodiments, each deposition cycle includes a further plasma processing step in which the substrate is contacted with a plasma to further facilitate film crystallization by increasing surface mobility with the heat generated by radical recombination on the surface. In other embodiments, a further plasma processing step is provided once a thin film of a desired thickness has been deposited, or at intervals during the deposition process. In some embodiments the plasma is provided in each cycle. In other embodiments the plasma is provided once every 10 to 20 cycles and is generated from nitrogen and/or hydrogen.

Thermal Atomic Layer Deposition of InN

In some embodiments no plasma or activated species is used in the InN ALD cycles. In some embodiments the thermal ALD InN cycles can be used in combination with one or more plasma ALD cycles for depositing another material or additional metal nitride.

In some embodiments, an evaporation temperature for the In reactant may be from about 180° C. to about 220° C. The deposition temperature is preferably below about 800° C., below about 700° C., below about 600° C., below about 550° C., below about 500° C., below about 450° C., or below about 400° C. The reaction chamber may be part of a flow-type reactor. In some embodiments the deposited film is an epitaxial or single-crystal film.

The In reactant may be an In halide, such as $InCl_3$ or $InI_3$ and the second reactant may be a nitrogen containing reactant such as $NH_3$ or $N_2H_4$. The temperature of the process is preferably below about 800° C., below about 700° C., below about 600° C., below about 500° C. or below about 400° C. The reaction chamber may be part of a flow-type reactor. In some embodiments the deposited film is an epitaxial or single-crystal film.

In other embodiments, a thermal ALD process uses an organic In precursor, such as cyclopentadienylindium (InCp), dimethylethylindium (DMEI), trimethylindium (TMI) or triethylindium (TEI). In some embodiments, the organic In precursor has the formula $InR_3$, wherein the R is selected from the group consisting of substituted, branched, linear and cyclic C1-C10 hydrocarbons. In some embodiments reactants are evaporated at room temperature. The second reactant may be a nitrogen containing reactant such as $NH_3$ or $N_2H_4$. The deposition temperature of the process is preferably selected such that the In reactant does not decompose, for example below about 400° C. or below about 300° C., depending on the particular reactant employed. The reaction chamber may be part of a flow-type reactor. In some embodiments the deposited film is an epitaxial or single-crystal film.

Plasma Enhanced Atomic Layer Deposition of InN

In other embodiments, a plasma ALD process is used to deposit an InN containing thin film. In some such embodiments, the In precursor may be, for example, an In halide precursor, such as $InCl_3$ or $InI_3$. The evaporation temperature for the In reactant may be from about 180° C. to about 220° C. in some embodiments. The second reactant comprising N may be a nitrogen plasma containing precursor. In some embodiments the nitrogen plasma is generated in situ, for example above or directly in view of the substrate. In other embodiments the nitrogen plasma is formed remotely, for example upstream of the substrate. In some such embodiments, the nitrogen plasma does not have a substantial amount of N ions, and is primarily N atoms. In some embodiments the second reactant also comprises hydrogen plasma. In some embodiments the second reactant is a mixture of $H_2/N_2$ plasma. In some embodiments the second reactant is a nitrogen and hydrogen containing plasma created from a $H_2/N_2$ gas mixture which preferably has a $H_2:N_2$ ratio above 3:1, more preferably above 4:1 and most preferably above 5:1. In some embodiments $H_2/N_2$ ratios from about 5:1 to about 10:1 can be used. In some embodiments the ratio of hydrogen to nitrogen can be selected to deposit a film having desired properties, such as density, roughness, crystallinity, and composition. The reaction temperature may be, for example, less than about 500° C., less than about 400° C., less than about 300° C., less than about 250° C., or even less than about 200° C. The process may be performed in a flow-type reactor. In some embodiments the deposited film is an epitaxial or single-crystal film.

The In reactant may be an organic In precursor, such as cyclopentadienylindium (InCp), dimethylethylindium (DMEI), trimethylindium (TMI) or triethylindium (TEI), and the second reactant may be a nitrogen containing plasma, and may comprise atomic nitrogen or nitrogen radicals, and may be made for example, from $NH_3$ or $N_2/H_2$ mixture. The temperature of the process is preferably below about 500° C., below about 400° C., below about 300° C., below about 250° C. or below about 200° C. The reaction chamber may be part of a flow-type reactor. In some embodiments the deposited film is an epitaxial or single-crystal film.

In other plasma ALD processes an organic In reactant is used, such as dimethylethylindium (DMEI), trimethylindium (TMI) or triethylindium (TEI). In some embodiments, the organic In precursor has the formula $InR_3$, wherein the R is selected from the group consisting of substituted, branched, linear and cyclic C1-C10 hydrocarbons. The In precursor may be evaporated at room temperature. The second reactant comprising N may be a nitrogen plasma containing precursor. In some embodiments the nitrogen plasma is generated in situ, for example above or directly in view of the substrate. In other embodiments the nitrogen plasma is formed remotely, for example upstream of the substrate. In some such embodiments, the nitrogen plasma does not have a substantial amount of N ions, and is primarily N atoms. In some embodiments the second reactant also comprises hydrogen plasma. In some embodiments the second reactant is a mixture of $H_2/N_2$ plasma. The reaction temperature is generally chosen such that the In precursor does not decompose and may be, for example, less than about 400° C., less than about 300° C. or even less than about 200° C., depending on the precursor. The process may be performed in a flow-type reactor. In some embodiments the deposited film is an epitaxial or single-crystal film.

In some embodiments the plasma power can be varied. Preferably the plasma power supplied is about 100 W or more. In some embodiments the plasma power is greater than about 200 W, preferably greater than about 300 W, more preferably greater than about 400 W, and in some cases above about 500 W or 600 W. In some embodiments the plasma parameters can be selected to achieve desired properties in the deposited film, such as the film thickness, roughness, and density.

In some embodiments the reaction conditions can be selected to deposit a film with a desired density. In some embodiments the density is greater than about 3 $g/cm^3$. In some embodiments the density is greater than about 4.5 $g/cm^3$. In some embodiments the density of the deposited film is greater than about 5 $g/cm^3$. In some embodiments the density of the deposited film is greater than about 5.5 $g/cm^3$ In some embodiments the reaction conditions can be selected to deposit a film with a desired roughness or smoothness. In some embodiments the roughness is less than about 4 nm. In some embodiments the roughness is less than about 3 nm. In some embodiments the roughness of the deposited film is preferably less than about 2 nm. In some embodiments the roughness of the deposited film is preferably less than about 1.5 nm.

In some embodiments the plasma ALD InN cycles can be used with thermal ALD cycles for depositing another material or additional metal nitride.

Example 1

InGaN thin films were deposited using 1000 deposition cycles. InN and GaN deposition cycles were used. The ratio between the InN and GaN deposition cycles was varied. The substrate temperature was 200° C. during the film deposition. TEG and nitrogen plasma were used for the GaN deposition cycles. TMI and nitrogen plasma were used for the InN deposition cycles. The plasma power supplied was 400 W.

Figure 2A:
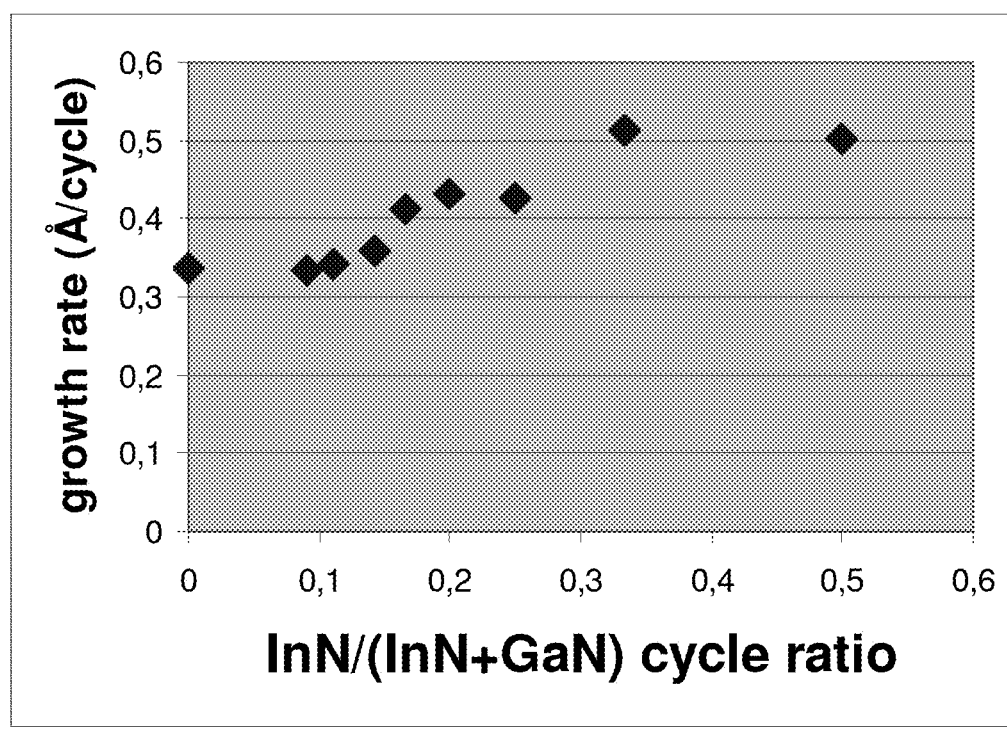
FIG. 2A is a graph showing the growth rate versus InN/(InN+GaN) cycle ratio in accordance with one embodiment.

FIG. 2A shows the growth rate for the deposited films for various InN/(InN+GaN) ratios. The growth rate was between about 0.3 and 0.5 Å per cycle.

Figure 2B:
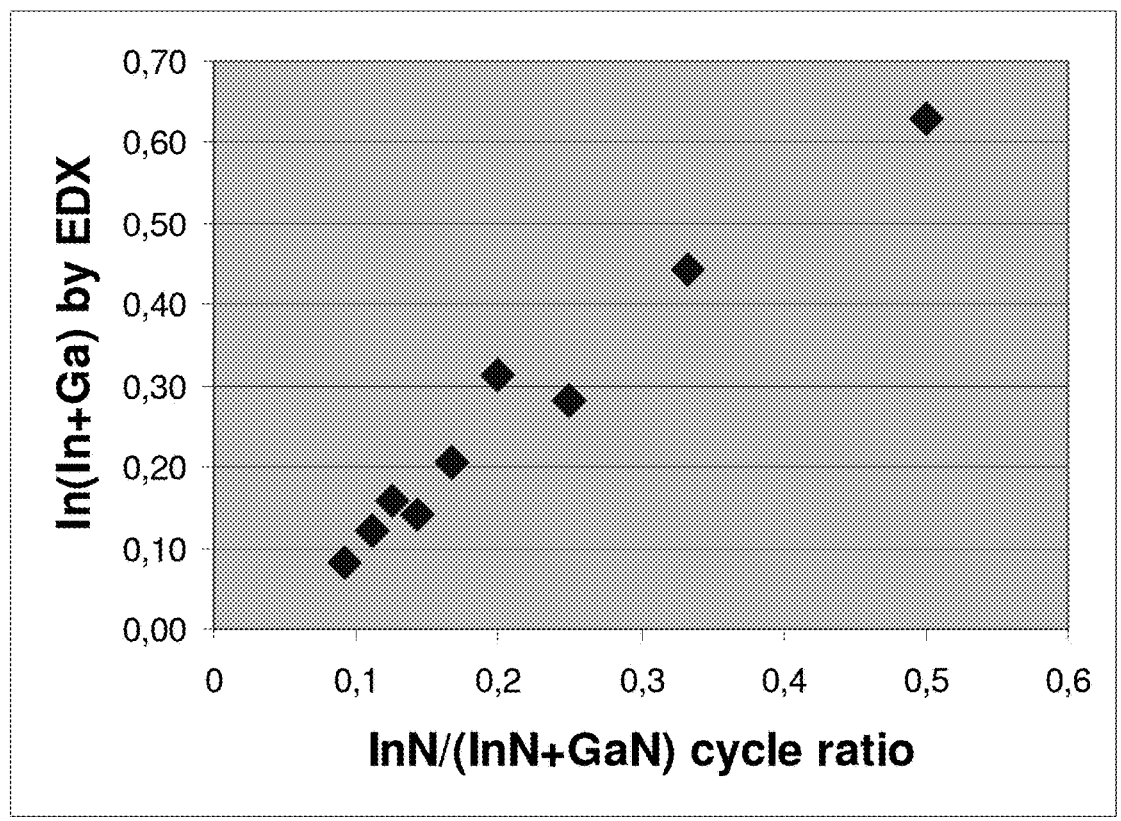
FIG. 2B is a graph showing In/(In+Ga) ratio versus InN/(InN+GaN) cycle ratio in accordance with one embodiment.

FIG. 2B shows the In/(In+Ga) content as measured by EDX for the deposited films for various InN/(InN+GaN) ratios. The indium content in the films increased with an increased InN/(InN+GaN) ratio.

Example 2

Figure 3A:
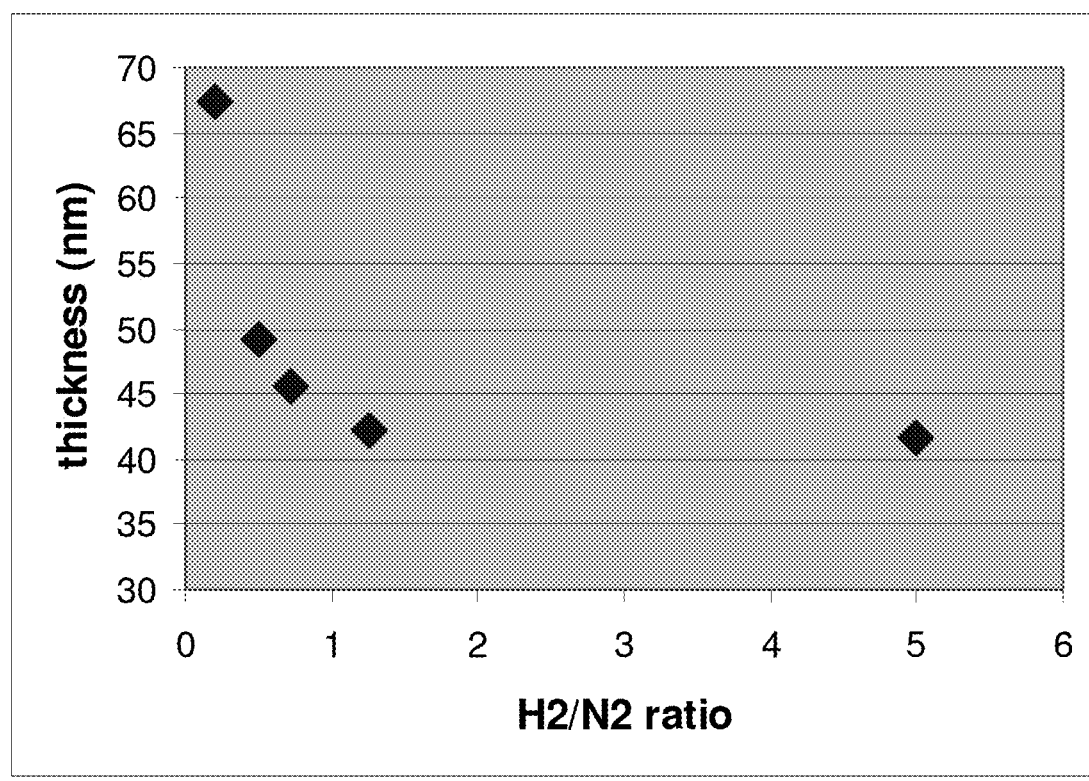
FIG. 3A is a graph showing the thickness of deposited InGaN films versus hydrogen/nitrogen ratio in accordance with one embodiment.
Figure 3B:
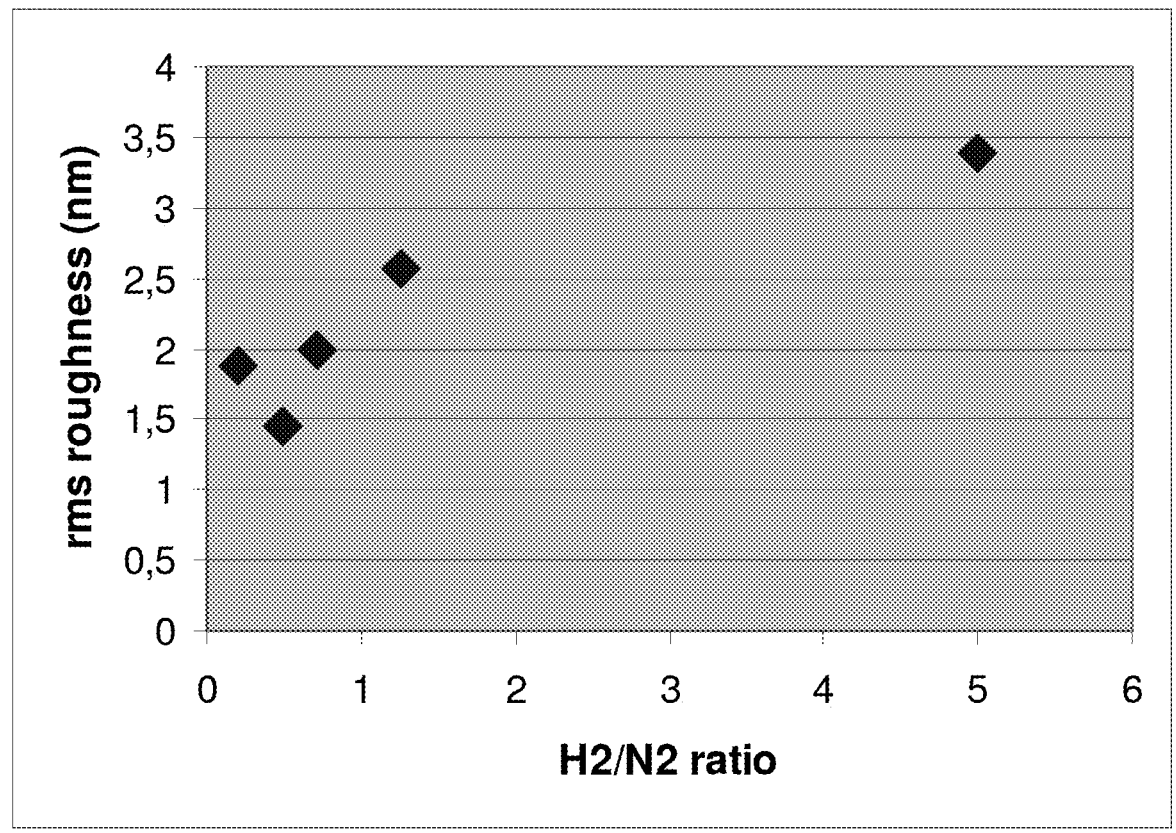
FIG. 3B is a graph showing the roughness of deposited InGaN films versus hydrogen/nitrogen ratio in accordance with one embodiment.
Figure 3C:
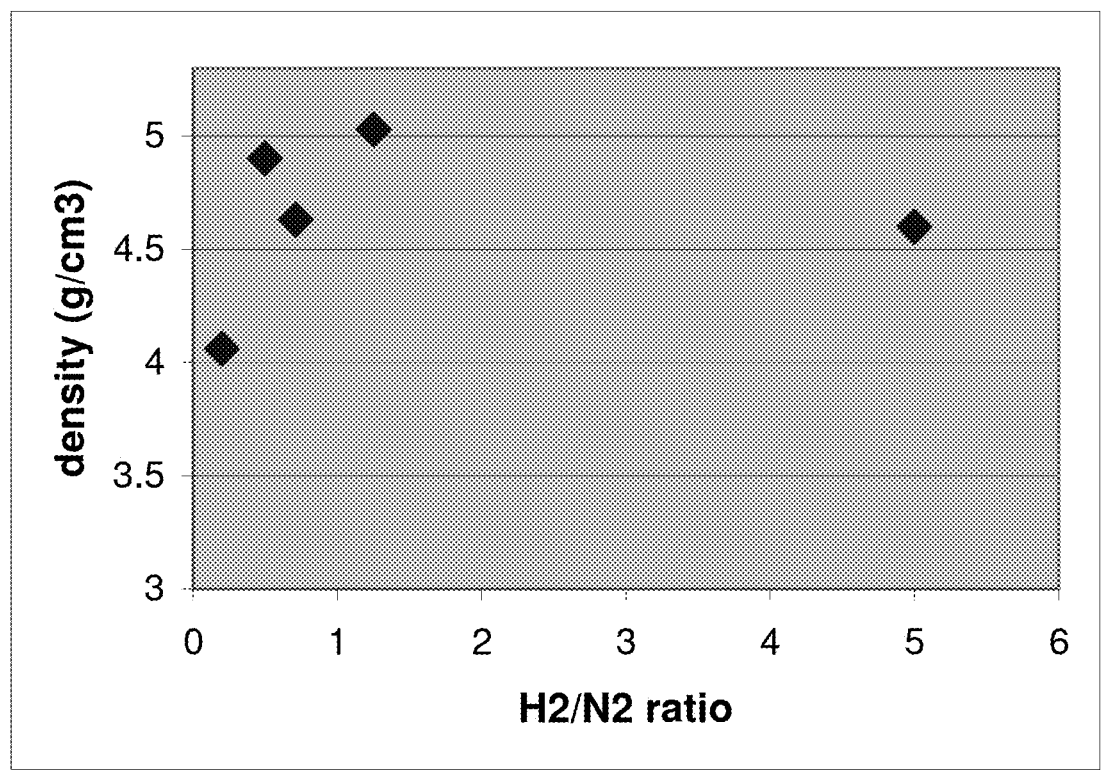
FIG. 3C is a graph showing the density of deposited InGaN films versus hydrogen/nitrogen ratio in accordance with one embodiment.

InGaN films were deposited with various hydrogen:nitrogen ratios. The InGaN thin films were deposited using 1000 deposition cycles. InN and GaN deposition cycles were used. The substrate temperature was 200° C. during the film deposition. TMG and a mixture of hydrogen/nitrogen plasma were used for the GaN deposition cycles. TMI and a mixture of hydrogen/nitrogen plasma were used for the InN deposition cycles. The plasma power supplied was 400 W. The ratio between the hydrogen and nitrogen gases was varied. FIGS. 3A-3C illustrate the thickness, roughness, and density for the deposited InGaN films. FIG. 3A shows that the thickness of the deposited film decreased as the hydrogen:nitrogen ratio increased. FIG. 3B shows that the roughness of the deposited film increased as the hydrogen:nitrogen ratio was increased. FIG. 3C shows that the highest film density was achieved using a hydrogen:nitrogen ratio of about 1.

Example 3

Figure 4A:
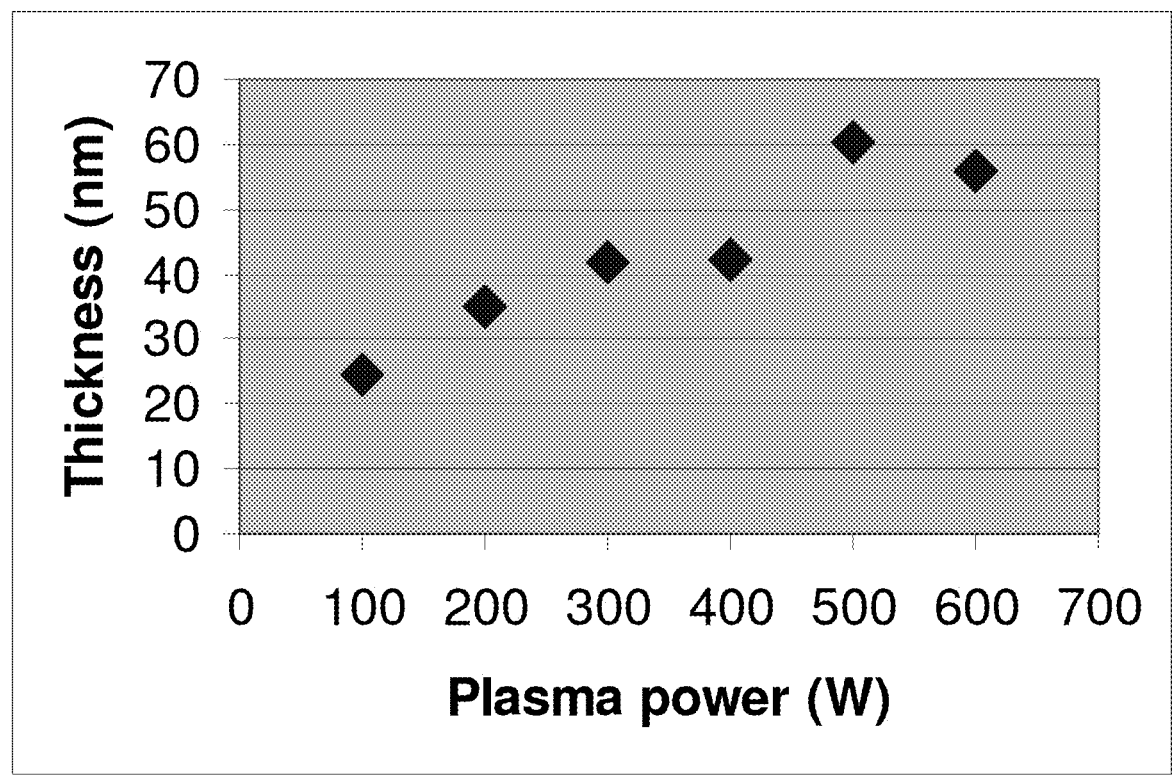
FIG. 4A is a graph showing the thickness of deposited InGaN films versus plasma power in accordance with one embodiment.
Figure 4B:
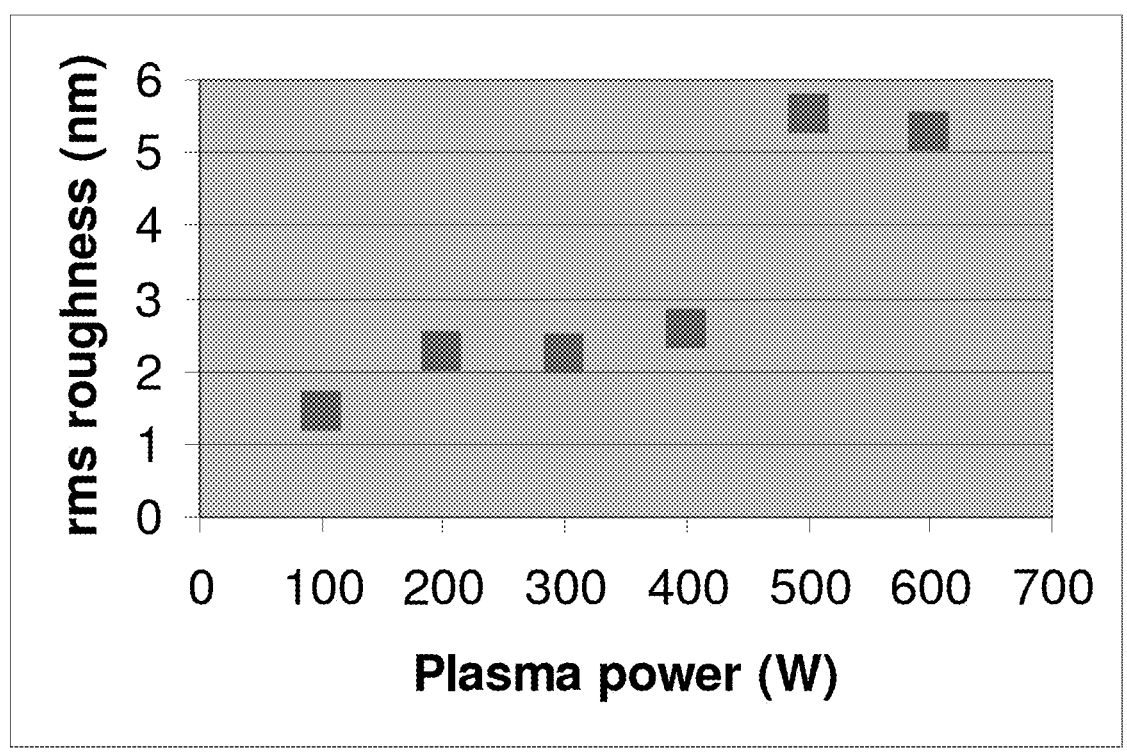
FIG. 4B is a graph showing the roughness of deposited InGaN films versus plasma power in accordance with one embodiment.
Figure 4C:
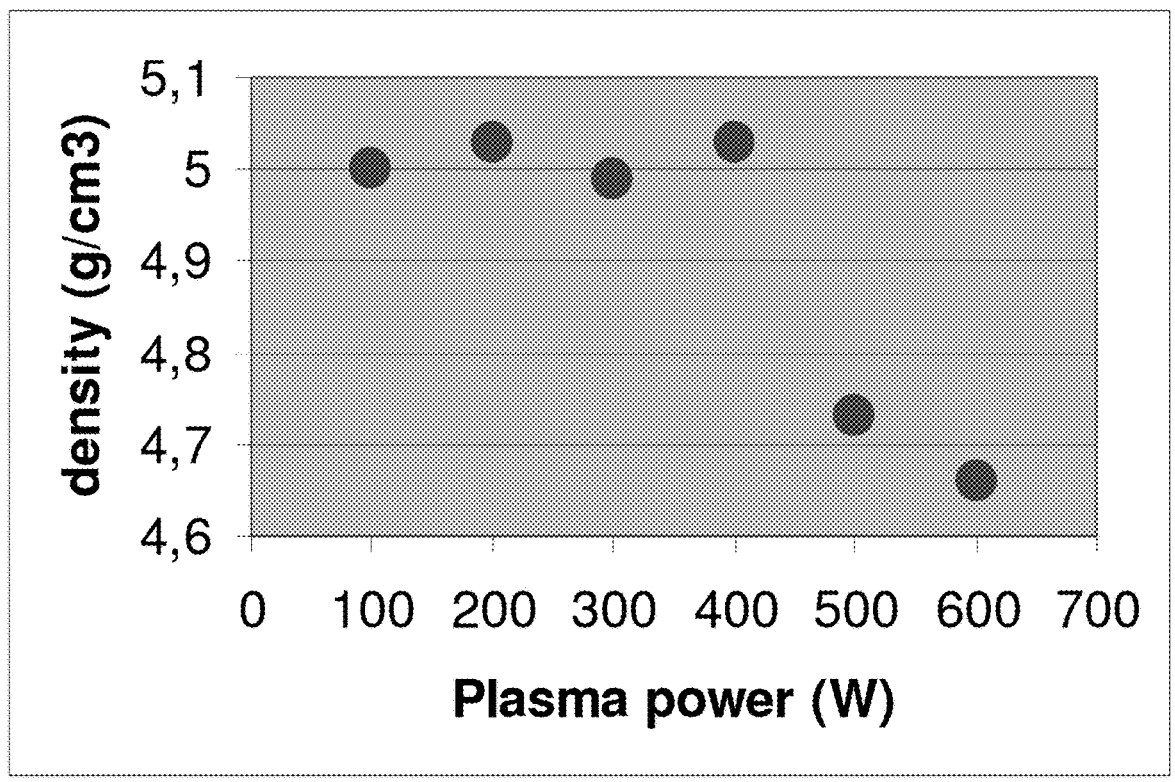
FIG. 4C is a graph showing the density of deposited InGaN films versus plasma power in accordance with one embodiment.

InGaN thin films were deposited using 1000 deposition cycles while varying the plasma power. FIGS. 4A-4C illustrate the thickness, roughness, and density for the deposited InGaN films. FIG. 4A shows that the thickness of the deposited film increased as the plasma power increased. FIG. 4B shows that the roughness of the deposited film increased as the plasma power increased. FIG. 4C shows that the density of the deposited film decreased with a plasma power of about 500 W or greater.

Example 4

Figure 5:
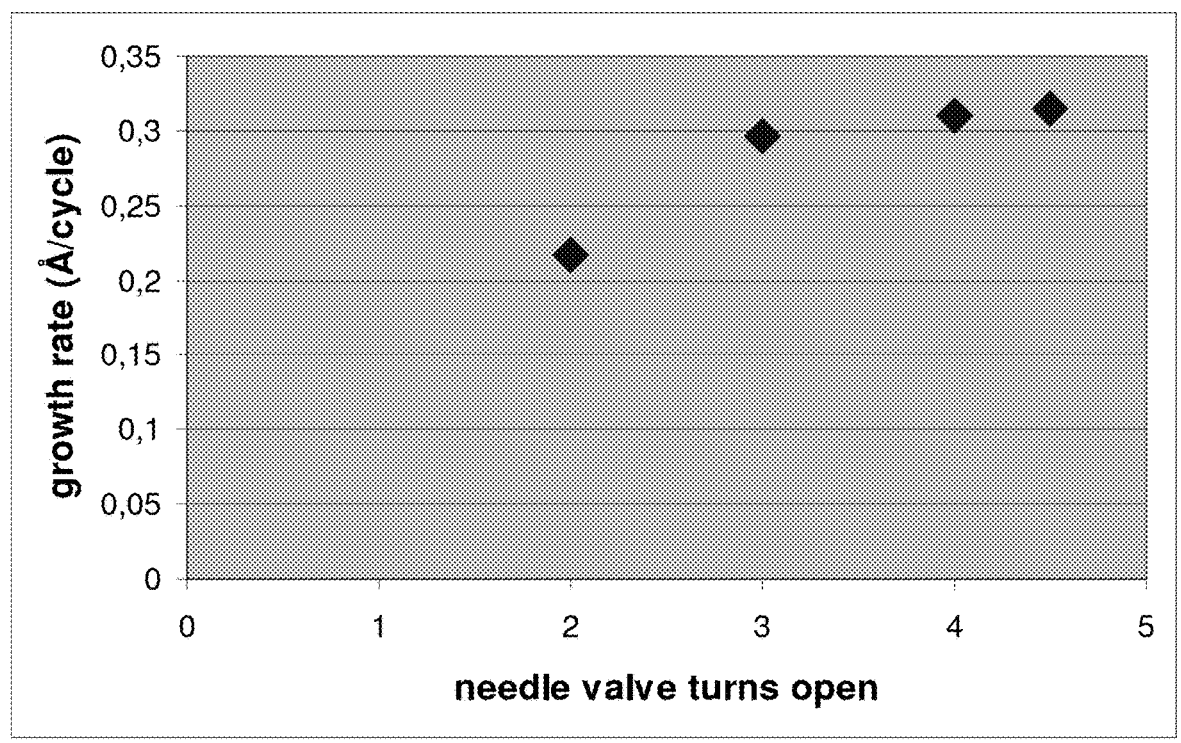
FIG. 5 is a graph showing the growth rate per cycle versus gallium reactant supply as represented by turns of the valve supplying the gallium reactant in accordance with one embodiment.

FIG. 5 shows the growth rate while varying the supply of gallium reactant to the reaction space. The supply of gallium reactant was varied by turning the needle valve that controlled the flow of reactant. The growth of GaN saturated after about 4 turns of the needle valve, thus illustrating that growth rate increases with increasing flow rate of gallium reactant up to a point, beyond which saturation occurs in each cycle.

Example 5

Figure 6A:
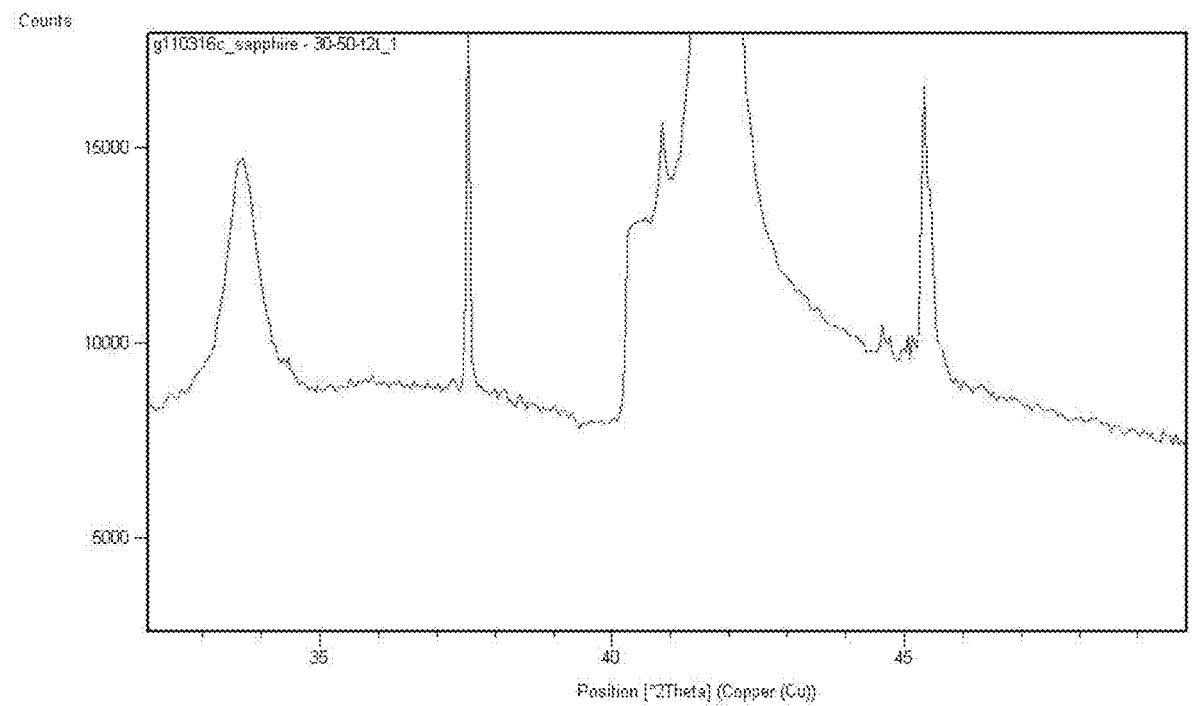
FIG. 6A is a glancing incidence x-ray diffraction (GIXRD) graph of a InGaN film deposited on sapphire in accordance with one embodiment.
Figure 6B:
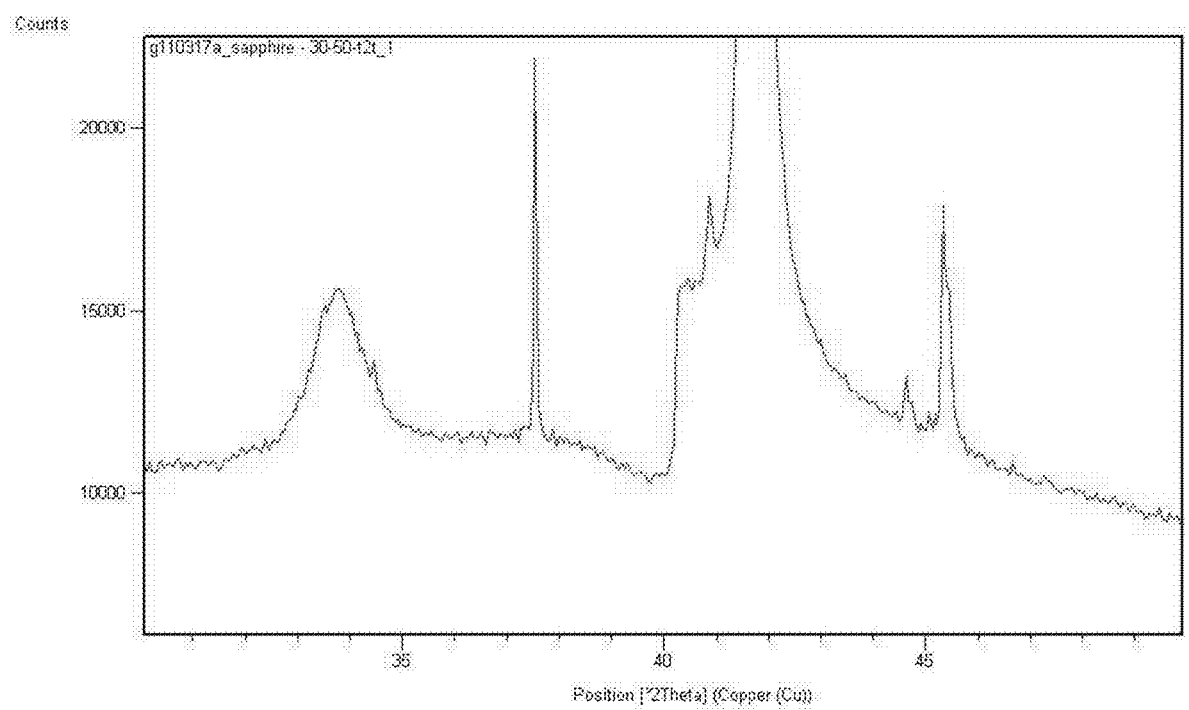
FIG. 6B is a glancing incidence x-ray diffraction (GIXRD) graph of a GaN film deposited on sapphire in accordance with one embodiment.
Figure 6C:
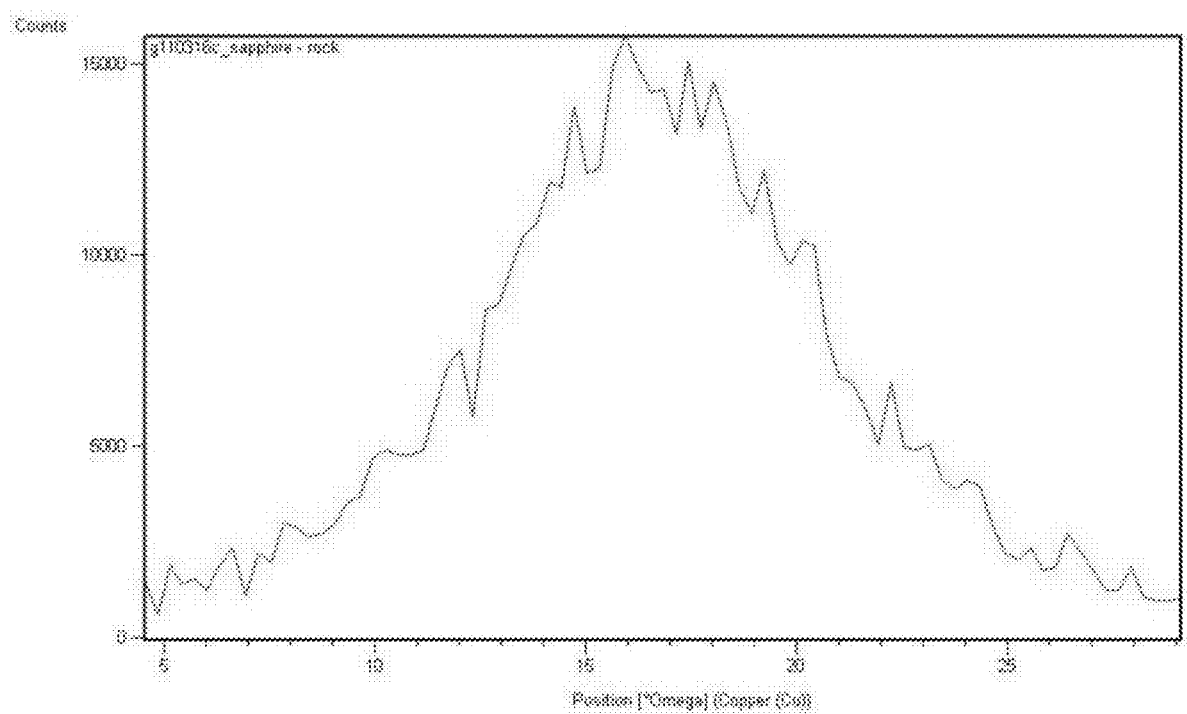
FIG. 6C is a glancing incidence x-ray diffraction (GIXRD) graph of a InGaN film deposited on sapphire in accordance with one embodiment.

FIGS. 6A-6C show glancing incidence x-ray diffraction (GIXRD) graphs for various 2θ values. FIG. 6A is an InGaN thin film deposited on sapphire. The largest peak in FIG. 6A corresponds to the (006) peak of sapphire with a smaller (002) peak. FIG. 6B is a GaN thin film deposited on sapphire. The largest peak in FIG. 6B corresponds to the (006) peak of sapphire with a smaller (002) peak. FIG. 6C shows a portion of the GIXRD data from 6A. The rocking curve of (002) has a FWHM (Full Width at Half Maximum) of 8.3° on sapphire.

Example 6

Figure 7:
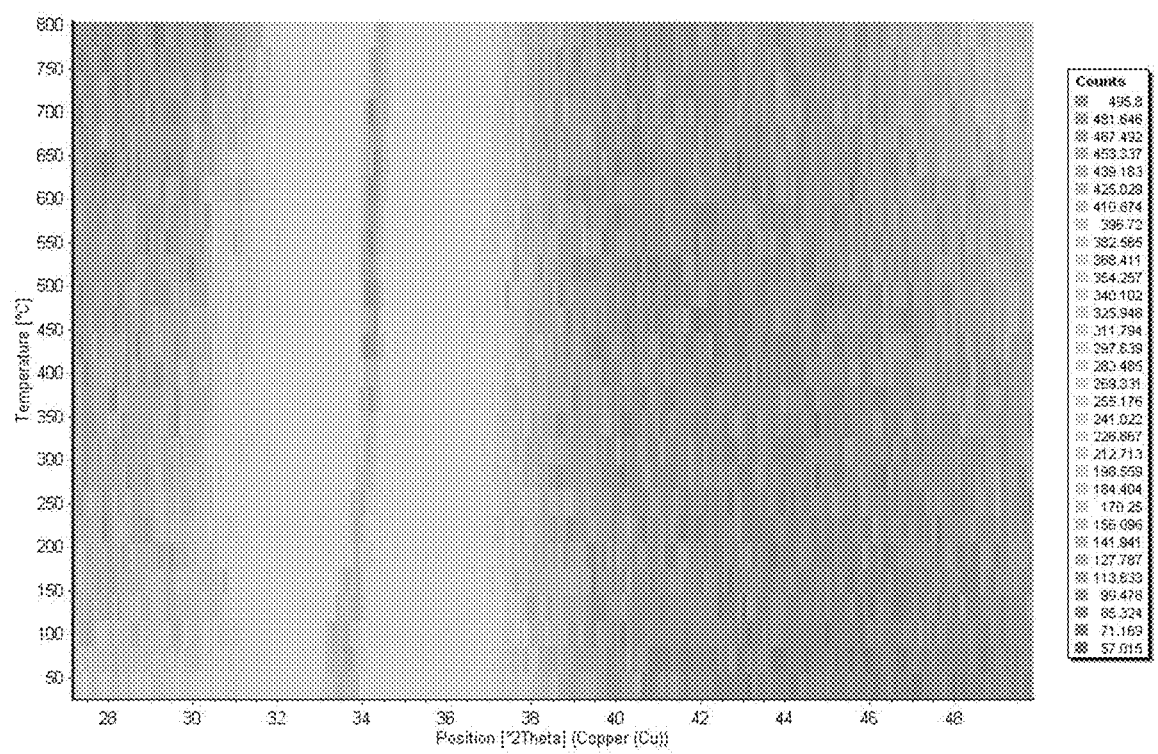
FIG. 7 is an x-ray diffraction graph of a InGaN film deposited on sapphire heat treated at various temperatures in accordance with one embodiment.

FIG. 7 shows temperature versus 2θ values with brighter/lighter areas indicating increased counts for the x-ray diffraction pattern. The peak value was around 33-34.6°, with increased temperature shifting the peak closer to the expected 34.6° value for GaN (002).

Example 7

InN thin films were deposited using trimethylindium (TMI) and $NH_3$-plasma as precursors. The substrate temperature was 200° C. during the film deposition. The deposition resulted in 0.5 Å/cycle growth rate and a refractive index of 1.9-2.0 in the deposited film. The cycle time was 6 seconds. 400 W plasma power was used and 50 sccm $NH_3$ flow was used during the plasma exposure.

Example 8

AlN thin films were deposited using an AlN cycle including trimethylaluminum (TMA) and $NH_3$-plasma. The substrate temperature was at room temperature i.e. about 20° C. during the film deposition. The film grew at a high rate, approximately 2.0 Å/cycle. The resulting film had a refractive index of 1.55. The cycle time was 6 seconds.

It will be appreciated by those skilled in the art that various modifications and changes can be made without departing from the scope of the invention. Similar other modifications and changes are intended to fall within the scope of the invention, as defined by the appended claims.

We claim:

1. A method for depositing a thin film comprising InN on a substrate in a reaction space by an atomic layer deposition process comprising a plurality of InN deposition cycles, each deposition cycle comprising:
    contacting the substrate with a In precursor such that no more than a single monolayer of the In precursor adsorbs on the substrate surface in a self-limiting manner; and
    contacting the substrate with a nitrogen precursor comprising a nitrogen (N) plasma, such that the nitrogen precursor reacts with the adsorbed In precursor to form InN, wherein the reaction space is part of a flow-type reactor.

2. The method of claim 1, wherein the deposited thin film is epitaxial or single-crystal film.

3. The method of claim 1, wherein the InN is deposited at a growth rate of less than 1.5 Å/deposition cycle.

4. The method of claim 1, wherein the InN is deposited at a growth rate of less than 1 Å/deposition cycle.

5. The method of claim 1, wherein the InN is deposited at a growth rate of less than 0.5 Å/deposition cycle.

6. The method of claim 1, wherein the deposition cycle additionally comprises contacting the substrate with a plasma pulse to provide heat for crystallization.

7. The method of claim 1, wherein the In precursor is an organic In compound.

8. The method of claim 7, wherein the organic In compound is cyclopentadienylindium (InCp), dimethylethylindium (DMEI), trimethylindium (TMI) or triethylindium (TEI).

9. The method of claim 7, wherein the organic In compound has a formula $InR_3$, wherein the R is selected from substituted, branched, linear or cyclic C1-C10 hydrocarbons.

10. The method of claim 1, further comprising a GaN deposition cycle thereby depositing a GaInN film.

11. An atomic layer deposition (ALD) process for forming an InN containing thin film on a substrate in a reaction chamber comprising a plurality of InN deposition cycles, each cycle comprising:
    providing a pulse of a first vapor phase In halide reactant into the reaction chamber to form no more than about a single molecular layer of the first reactant on the substrate;
    removing excess first reactant from the reaction chamber;
    providing a pulse of a second vapor phase N reactant to the reaction chamber such that the second vapor phase reactant reacts with the first reactant on the substrate to form InN, wherein the second vapor phase N reactant comprises N plasma; and
    removing excess second reactant and reaction byproducts, if any, from the reaction chamber.

12. The method of claim 11, wherein the InN thin film is deposited at a temperature below 800° C.

13. The method of claim 11, wherein the InN thin film is deposited at a temperature below 400° C.

14. The method of claim 11, wherein the reaction chamber is part of a flow-type reactor.

15. The method of claim 11, wherein the deposited InN thin film is an epitaxial or single-crystal film.

16. An atomic layer deposition (ALD) process for forming an InN containing thin film on a substrate in a reaction chamber comprising a plurality of InN deposition cycles, each cycle comprising:
  providing a pulse of a first vapor phase in halide reactant into the reaction chamber to form no more than about a single molecular layer of the first reactant on the substrate;
  removing excess first reactant from the reaction chamber;
  providing a puke of a second reactant comprising nitrogen plasma to the reaction chamber such that the second reactant reacts with the first reactant on the substrate to form InN, and
  removing excess second reactant and reaction byproducts, if any, from the reaction chamber.

17. The method of claim 16, wherein the In precursor is $InCl_3$ or $InI_3$.

18. The method of claim 16, wherein the nitrogen plasma is formed in situ.

19. The method of claim 16, wherein the nitrogen plasma is formed remotely.

20. The method of claim 16, wherein the nitrogen plasma does not have substantial amount of N ions when it contacts the substrate.

21. The method of claim 16, wherein the second reactant further comprises hydrogen plasma.

22. The method of claim 16, wherein the InN thin film is deposited at a temperature below 500° C.

23. An atomic layer deposition (ALD) process for forming an InN containing thin film on a substrate in a reaction chamber comprising a plurality of deposition cycles, each cycle comprising:
  providing a pulse of a first organic In precursor into the reaction chamber to form no more than about a single molecular layer of the first reactant on the substrate;
  removing excess first reactant from the reaction chamber;
  providing a pulse of a second reactant comprising N plasma to the reaction chamber such that the second reactant reacts with the first reactant on the substrate to form InN, and
  removing excess second reactant and reaction byproducts, if any, from the reaction chamber.

24. The method of claim 23, wherein the InN thin film is deposited at a temperature below 400° C.

25. The method of claim 23, wherein the InN thin film is deposited at a temperature below 200° C.

26. The method of claim 23, wherein the ALD process is carried out at a temperature at which the In precursor does not decompose.

* * * * *

UNITED STATES PATENT AND TRADEMARK OFFICE
CERTIFICATE OF CORRECTION

PATENT NO. : 10,707,082 B2
APPLICATION NO. : 13/525072
DATED : July 7, 2020
INVENTOR(S) : Haukka et al.

Page 1 of 1

It is certified that error appears in the above-identified patent and that said Letters Patent is hereby corrected as shown below:

On the Title Page

On page 2, Column 1, item (56), Other Publications, Lines 4-5, delete "nanotechology?"" and insert --nanotechnology?"--.

On page 2, Column 2, item (56), Other Publications, Lines 42, delete "A1N" and insert --AlN--.

In the Specification

Column 1, Line 42, delete "cycling." and insert --cycling,--.

Column 4, Line 6, delete "embodiment;" and insert --embodiment.--.

Column 7, Line 8, delete "inert," and insert --inert--.

Column 12, Line 22 approx., after "cm³" insert --.--.

Column 13, Line 32, delete "20" and insert --2θ--.

Column 13, Line 44, delete "20" and insert --2θ--.

In the Claims

Column 15, Line 5, Claim 16, delete "in" and insert --In--.

Column 15, Line 10, Claim 16, delete "puke" and insert --pulse--.

Column 15, Line 16, Claim 17, delete "precursor" and insert --reactant--.

Signed and Sealed this
Twenty-second Day of September, 2020

Andrei Iancu
*Director of the United States Patent and Trademark Office*